United States Patent [19]

Wah Lo

[11] Patent Number: 4,852,972

[45] Date of Patent: Aug. 1, 1989

[54] METHOD OF CONTROLLING VARIATION OF DENSITY OF IMAGES IN 3-D PICTURES

[76] Inventor: Allen K. Wah Lo, 5022 Hidden Branches Dr., Dunwoody, Ga. 30338

[21] Appl. No.: 59,742

[22] Filed: Jun. 8, 1987

[51] Int. Cl.$^4$ .................. G02B 26/04; G03B 27/22
[52] U.S. Cl. .................. 350/131; 354/115; 355/22
[58] Field of Search .............. 350/130, 131; 354/115, 354/114; 355/22

[56] References Cited

U.S. PATENT DOCUMENTS

| | | | |
|---|---|---|---|
| 2,002,090 | 5/1935 | Ives | 355/22 |
| 2,501,258 | 3/1950 | Bonnet | 350/131 |
| 3,895,867 | 7/1975 | Lo et al. | 354/114 |
| 3,953,869 | 4/1976 | Wah Lo et al. | 354/115 |
| 3,978,500 | 8/1976 | Brachet | 354/115 |
| 4,120,562 | 10/1978 | Lo et al. | 350/130 |
| 4,468,115 | 8/1984 | Lao | 355/22 |
| 4,493,551 | 1/1985 | Fine et al. | 355/22 |
| 4,650,282 | 3/1987 | Lo | 350/167 |

Primary Examiner—Bruce Y. Arnold
Assistant Examiner—Terry S. Callaghan
Attorney, Agent, or Firm—Harold L. Marquis

[57] ABSTRACT

Three-dimensional photographs produced with image bands of substantially equal density across the field of the lenticule are produced by increasing the intensity of exposure of the image bands near the edges of the lenticule in relation to the central image bands. This is accomplished by varying the duration of each exposure, or using a neutral density filter, a neutral density iris, a metallic iris with a multiple number of apertures, or by controlling the lamps in a multiple lamp housing. In addition, three-dimensional photographs are produced by a multiple number of successive exposures of short duration through the lenticules of the lenticular print film while the angle of projection of the enlarging lens is constantly changing. Exposure is made for a duration while the relative movement of the enlarging lens with respect to the lenticular print film is less than one-tenth of the aperture of the enlarging lens.

6 Claims, 5 Drawing Sheets

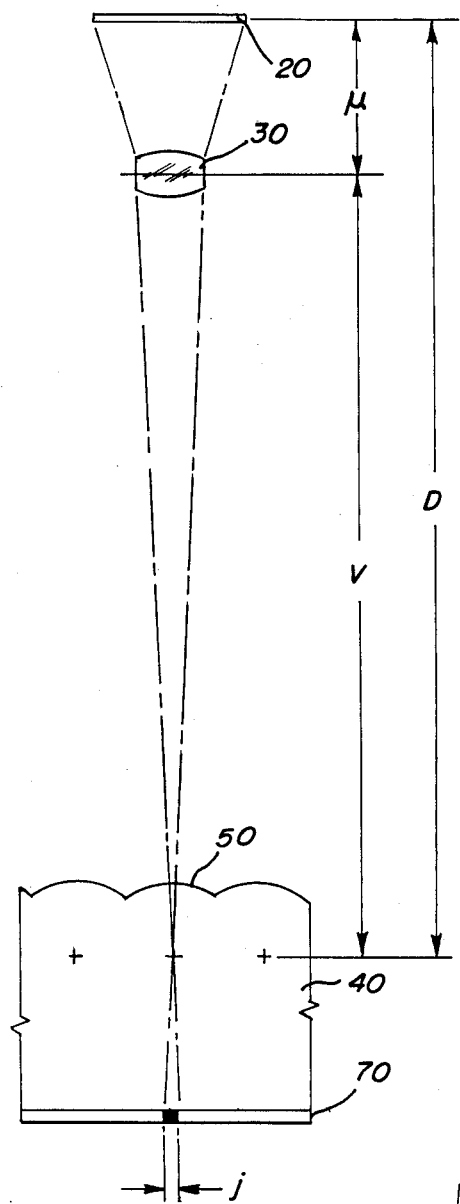
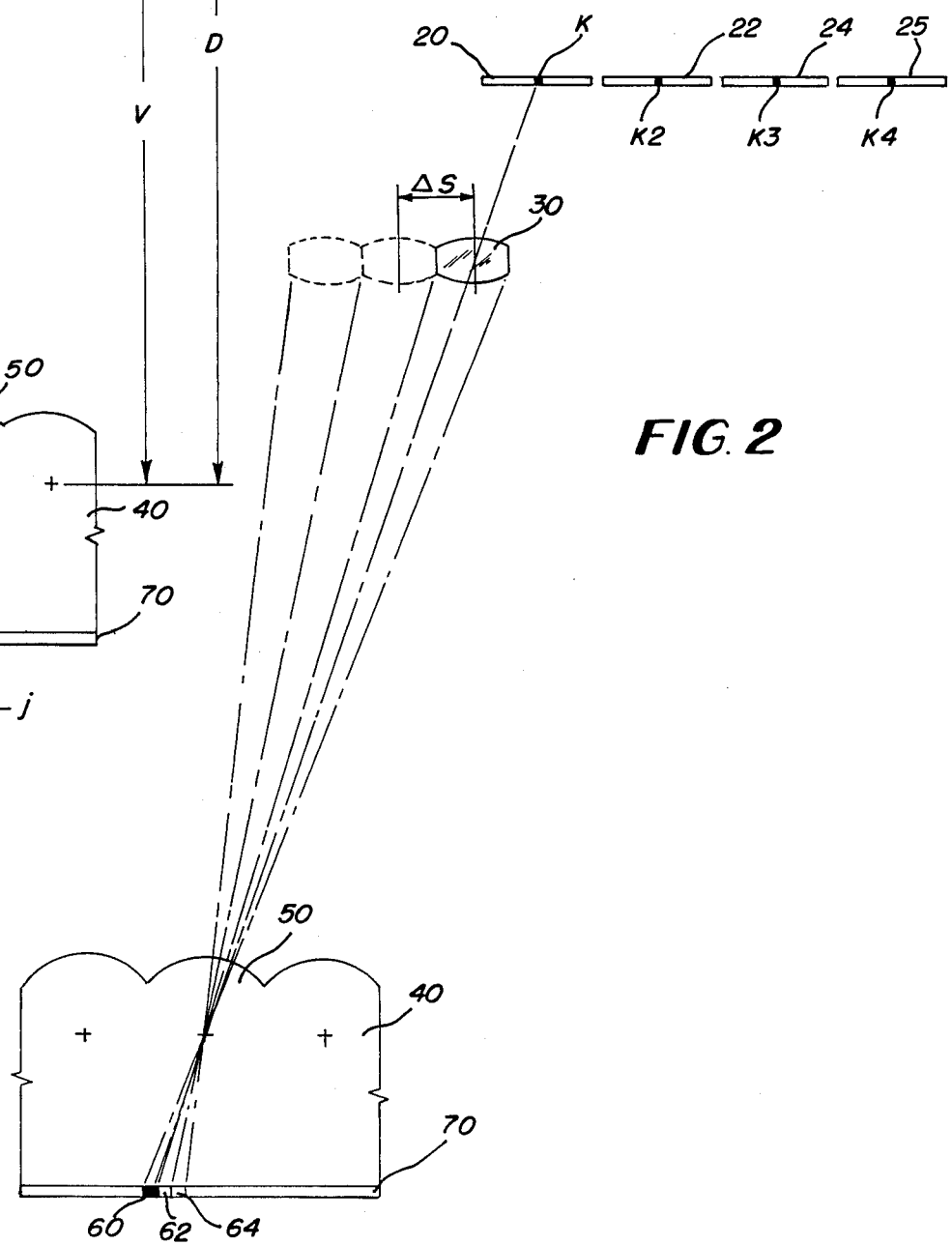
FIG.1
FIG.2

METHOD OF CONTROLLING VARIATION OF DENSITY OF IMAGES IN 3-D PICTURES

PRIOR ART

Lenticular screen type 3-D pictures are produced by composing a sequence of two-dimensional views of an object from different vantage points onto a lenticular print film.

The two-dimensional views are projected either sequentially or simultaneously through a lenticular screen exposing the photographic emulsion coating at the focal plane of the lenticules.

N. A. Valyus in "Stereoscopy" (Focal Press, 1966) at pages 199–203 discloses printing right and left images simultaneously onto the film. Only one condensed image from each two-dimensional view is printed. This method would require a large number of two-dimensional views to produce enough condensed images to fill up the spaces under the lenticules. This large number of condensed images is not commercially practical leaving a number of unexposed strips under each lenticule which results in an inferior three-dimensional photograph. Valyus contributed to the three-dimensional art by showing the method and reason for controlling the displacement of foreground and background images.

Dudley "Applied Optics & Optical Engineering" (Rudolf Kingslake, Ed., 1965) discloses at pages 114–116 the movement of the lenticular screen and the intermittent exposure of each of the eight images recorded on the film.

Okoshi in "Three-Dimensional Imaging Techniques" (1976) on pages 71–88 discloses the use of several projectors to project the images onto the emulsion. Okoshi analyzes in detail the theory of optimum projector separation and printing images on the photographic emulsion. Okoshi also analyzes the spread of the image on the emulsion and points out that excessive spread degrades the resultant directivity of the picture.

Lo and Nims in U.S. Pat. No. 3,895,867 (July 22, 1975) Col. 8 disclose a technique for recording images on all of the film areas underlying the lenticules. This was achieved by repeatedly turning off the light on the projector and intermittently shifting the screen or film. The disadvantage of this method of intermittently spreading the condensed images is the time required to make each of the incremental changes of the angle of projection. The sequence of rapid stopping and restarting of the negative, enlarging lens and the print film during composing creates shocks and generates vibrations that cause overlapping of the condensed images and decreases the sharpness of the resulting three-dimensional image. This patent also shows a technique of continuously spreading the condensed image by leaving the projection light on during the movement of the projector. This causes the condensed image to continuously overlap across the entire width of the lenticule. The disadvantage of this scanning technique is that the image overlapping reduces image sharpness and contrast and degrades the resulting three-dimensional image.

The following patents also disclose early composing techniques for three-dimensional pictures:

Japanese Patent No. 39-14466 issued 3/16/64
Japanese Patent No. 42-5473 issued 3/6/67
Japanese Patent No. 49-607 issued 1/9/74
Lo and Nims in U.S. Pat. No. 4,120,562 (Oct. 17, 1978) disclose a method of scanning the projected image to fill the lenticule with images. The composing apparatus disclosed in this patent is also structured for changing the angle of projection by a predetermined amount during the scanning operation.

Lao in U.S. Pat. No. 4,468,115 (Aug. 28, 1984) discloses a projector in which the lamp housing moves continuously to prevent jerking due to rapid stops and starts. Its continuous scanning results in considerable overlapping of images which reduces the sharpness of the picture.

The intermittent projection disclosed in the prior art suffers from the disadvantage that a large number of projections must be made in order to fill the area behind the lenticule with images which makes this system commercially impractical. A continuous scanning method results in filling the area behind each lenticule with images. However, the overlapping of the images reduces the clarity of the picture.

The prior art discloses using equal intensity of light in exposing the image bands across the field of the lenticule. Because of the vignetting effect of the lenticule, the light exposing the image bands near the edge of the lenticule is less than near the center of the lenticule. This results in the image bands near the center of the lenticule being brighter than the image bands near the edge of the lenticule. Consequently, when a person is viewing a 3-D picture, the eyes may see a stereo pair formed by two image bands of different density. The image bands near the center of the lenticule will be brighter than the image bands near the edge of the lenticule. The unmatched density of the stereo pairs requires extra effort of the eyes to adjust to viewing the picture resulting in eyestrain. The vignetting effect is in part due to the fact that the light has to travel a greater distance from the curved screen to the image band near the edge of the lenticule than to the image bands near the center.

SUMMARY OF THE INVENTION

In accordance with this invention, a new composing method is utilized to produce stereoscopic pictures with image bands of a density that are approximately equal across the field of the lenticule. This results in images of the same density so that from any viewing angle a person can see a stereo pair of images of identical density which is the case in viewing a real object. This is accomplished by one of several methods. The duration of exposure of each of the image bands can be varied. The same result can be achieved by using a neutral density filter, a neutral density iris or a metallic filter with a multiple number of small apertures. Alternatively, the number of lamps in a multiple lamp housing can be controlled to vary the intensity of light.

The quality of three-dimensional pictures produced by the above method can be further enhanced by reproducing the two-dimensional views into a multiple number of discrete condensed images which are printed edge-to-edge under the lenticules of the lenticular print film with minimal overlapping or without being interrupted by unexposed strips between the discrete condensed images.

A multiple number of discrete condensed images is achieved by making a multiple number of successive exposures of short duration through the lenticules of the lenticular print film while the angle of projection of the enlarging lens is changing. Each exposure is made while the enlarging lens is continuously travelling and for a duration of travel no greater than one-tenth of the aperture of the lens. The negative is also travelling while the print film is maintained stationary. Preferably, the exposure is for a duration as short as possible to obtain a high quality image. The distance travelled by the lens during the duration of the exposure is sufficient so that the images are printed edge-to-edge under the lenticules with minimal overlapping and without unexposed strips between the discrete condensed images.

The angle of projection can also be changed by moving the enlarging lens and print film but keeping the negative stationary. A third method involves moving the negative and lenticular print film while keeping the enlarging lens stationary. In all of these methods, the duration of exposure is not greater than the time required for the line of projection to move horizontally a distance that is equivalent to a distance not greater than one-tenth of the aperture of the enlarging lens as measured in the same horizontal plane of the lens. Preferably, the duration of exposure is kept as short as is consistent with printing a high quality image.

An optional feature of this method is to move the lens at a relative speed that is faster while the projection light is off than when the exposure is made. This decreases the amount of time required to print the film and more importantly reduces overlapping of images on the lenticular film.

As a result of the new composing technique, stereoscopic pictures are produced on lenticular print film in which the discrete condensed images are printed edge-to-edge with minimal overlapping and without interruption by unexposed strips between the discrete condensed images. Because the enlarging lens is continuously moving, the possibility of distortions due to vibration by starting and stopping of the lens is greatly reduced. Only the projection light is turned on and off as the exposures are made. The short duration of exposures freezes all motion during exposure resulting in improved image quality. The absence of starting and stopping reduces the vibration that is inherent in the intermittent motion technique previously used.

The width of the discrete image band is a function of the width of the aperture of the enlarging lens, the distance between the enlarging lens and the lenticular print film and the thickness of the lenticular print film.

An apparatus is also provided for the continuous changing of the angle of projection and intermittently controlling the light source.

BRIEF DESCRIPTION OF THE DRAWINGS

FIG. 1 is a diagrammatic view showing the width of the discrete condensed image in relation to the width of the aperture of the enlarging lens.

FIG. 2 is a diagrammatic view showing the travelling distance of the enlarging lens between each exposure to form the discrete images.

DETAILED DESCRIPTION OF THE DRAWINGS

Figure 3:
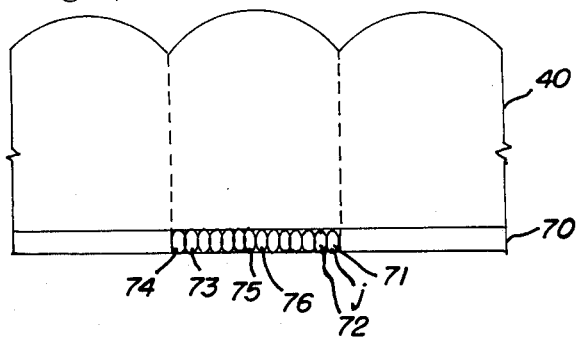
FIG. 3 is a diagrammatic view showing the arrangement of the discrete condensed images of this invention.

Continuous Scanning with Exposures of Short Duration

FIG. 2 is a diagrammatic view showing the travelling distance of the enlarging lens between each exposure to form the discrete images on the film. When composing a 3-D picture, the first 2-D view negative 20 is positioned in the enlarger so that proper cropping is made and a common reference point K on the 2-D view negative is selected to register at a particular location 60 on the lenticular print film 40. The first 2-D view negative is then projected by the enlarging lens 30 through the curved lenticule 50 of the lenticular print film 40 and a series of successive short cycle exposures is made while the enlarging lens 30 is continuously travelling to change the angle of projection, and a series of uninterrupted and minimal overlapping discrete condensed images 60, 62, 64 is formed on the photographic emulsion layer 70 over a predetermined portion under the lenticule 50. Each of the exposures is made for a duration no greater than the time that the enlarging lens is travelling a distance approximately equal to one-tenth of the width of the aperture of the enlarging lens (1/10 $\Delta$S). Preferably, the exposure is for a duration as short as possible to produce high quality images. As the exposures are made, the 2-D view negative 20 is also moving in the same direction in proportion to the travelling distance of the enlarging lens in order to keep the selected common reference point K on the 2-D view negative properly registered at the same location on the lenticular print film 40.

After the completion of the exposures of the first 2-D view negative, the second 2-D view negative 22 is moved into the same position in the enlarger so that the common selected reference point K2 is registered at the same location (+) on the lenticular print film 40. The same procedure is repeated to expose the remaining 2-D view negatives 24, 25 to complete the composing of the 3-D picture.

Each of the two-dimensional views can be reproduced into the same number or a different number of discrete images depending upon the composition desired. Each of the 2-D images can be reproduced to cover an image band of the same width under the lenticule according to teachings of the prior art or the width of the image band can be varied according to the parallax value between the stereopair as more fully described in U.S. Pat. No. 4,650,282; Lo; Mar. 17, 1987; Visual Parallax Compensation 3-D Image Structure.

An optional feature of this invention is to vary the speed at which the lens and negative travel so that the travel is faster between exposures than during the exposure. This results in a reduction in distortion that may occur during exposure due to a high speed of travel.

The composing of a 3-D picture in accordance with this invention can be accomplished in any one of three ways:

(1) Changing the angle of projection by moving the enlarging lens and negative while holding the lenticular print film stationary. This method of composing a 3-D picture is described in detail above. Each exposure to produce a discrete condensed image is made during a portion of the interval while the enlarging lens is travelling by a distance computed as follows:

$$S = E/F$$

where
- S is the travelling distance of the enlarging lens during which time each exposure is made to produce a discrete condensed image,
- E is the effective focal length of the enlarging lens 30,
- F is the F number of the enlarging lens 30.

When this composing technique is used, the duration of each exposure is no greater than the time required for the enlarging lens to travel a distance one-tenth of its aperture (1/10 ΔS).

(2) Changing the angle of projection by moving the enlarging lens and the lenticular print film while keeping the negative stationary.

Each exposure is made during the time when the enlarging lens is travelling by a distance computed as follows (FIG. 1):

$$S = (E/F)u/D$$

where
- S is the travelling distance of the enlarging lens during which time each exposure is made to produce a discrete condensed image,
- E is the effective focal length of the enlarging lens 30,
- F is the F number of the enlarging lens 30,
- u is the distance between the negative and the enlarging lens 30,
- D is the distance between the negative 20 and the lenticular print film 40.

As in the case of method (1), the length of the exposure using this method is no greater than the time required for the enlarging lens to travel one-tenth (1/10 ΔS) of the aperture.

(3) Changing the angle of projection by moving the negative and the lenticular print film while keeping the enlarging lens stationary. In this method, each exposure is made during that period the lenticular print film travels by a distance computed in accordance with the following formula (see FIG. 1):

$$Y = (E/F)v/D$$

where
- Y is the travelling distance of the lenticular print film 20 during which each exposure of the sequence of exposures is made to produce a discrete condensed image,
- E is the effective focal length of the enlarging lens 30,
- F is the F number of the enlarging lens 30,
- v is the distance between the enlarging lens and the lenticular print film 40,
- D is the distance between the negative 20 and the lenticular print film 40.

The duration of each exposure is no greater than the time required for the movement of the negative and the lenticular print film in relation to the enlarging lens which would be equivalent to the horizontal movement of the line of projection one-tenth of aperture of the enlarging lens as measured in the same horizontal plane as the lens. This relative movement can be computed utilizing the factors in the above formula.

The width of the discrete image i in FIG. 1 can be computed as follows:

$$i = (E/F)h/v$$

where
- i is the width of the discrete condensed image,
- E is the effective focal length of the enlarging lens 30,
- F is the F number of the enlarging lens 30,
- h is the focal length of the lenticule of the lenticular print film,
- v is the distance between the enlarging lens 30 and the center of the curvature of the lenticular print film 40.

The number of discrete condensed images can be computed as follows:

$$T = \theta/2 \arctan(E/F/2v)$$

where
- T is the total number of discrete condensed images required to fill up the lenticule,
- $\theta$ is the viewing angle of the lenticule of the lenticular print film 40,
- E is the effective focal length of the enlarging lens 30,
- F is the F number of the enlarging lens 30,
- v is the distance between the enlarging lens 30 and the lenticular print film 40.

FIG. 3 is a diagrammatic view showing the arrangement of the discrete condensed images of this invention. These images i are in a side-by-side relationship in the photographic emulsion layer 70. Images in FIG. 3 are neither overlapping nor is there an unexposed space between the images. The images in FIG. 3 are produced by the scanning technique but with the light supplied in short, intermittent bursts.

Figure 4:
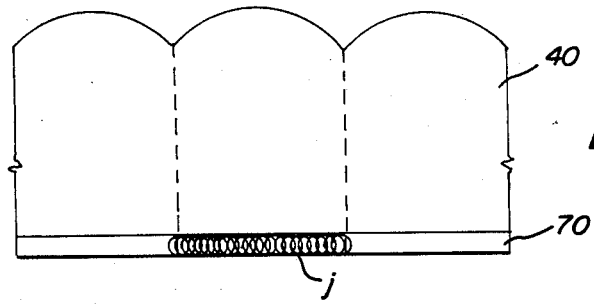
FIG. 4 is a diagrammatic view showing the overlapping scrambled image structure composed by the scanning method of prior art.

FIG. 4 is a diagrammatic view showing the overlapping, scrambled image structure composed by the scanning method of the prior art. The images in FIG. 4 are overlapping because the light on the enlarger is left on throughout the entire scanning process. This overlapping of images results in poor clarity.

Figure 5:
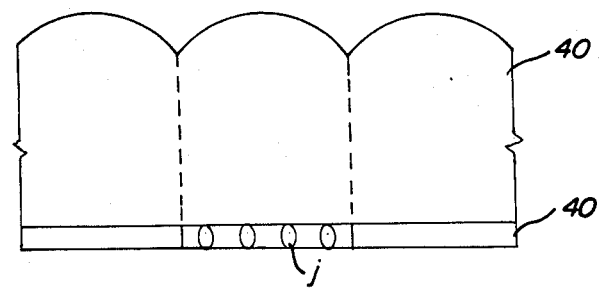
FIG. 5 is a diagrammatic view showing the discontinuous image structure of prior art.

FIG. 5 is a diagrammatic view showing the discontinuous image structure of the prior art. Images in FIG. 5 are produced by projecting an image from one position, moving the enlarger to another position and projecting another image. Space is left between the images because of the amount of time that would be required to project images to fill all the spaces in the lenticule.

Figure 6:
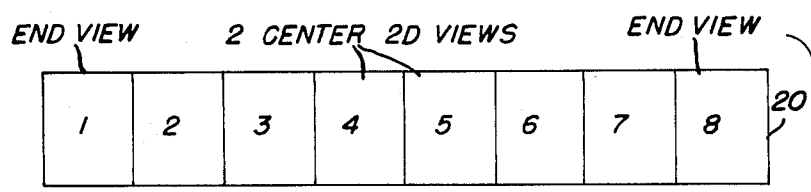
FIG. 6 is a diagrammatic view showing a series of 2-D views taken by a multilens or single lens 3-D camera.
Figure 6:
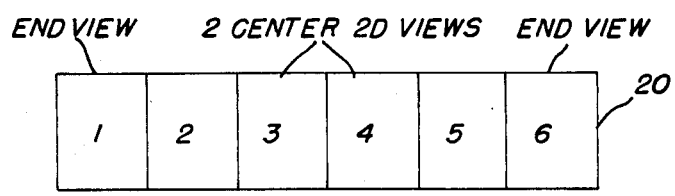
Figure 6:
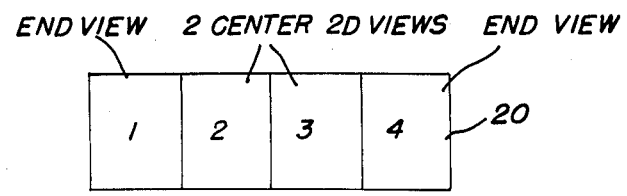

FIG. 6 is a diagrammatic view showing a series of 2-D views taken by a multi-lens or a single lens 3-D camera. Negatives 20 are used to produce three-dimensional photographs in accordance with the teaching of this invention. Views in these negatives are taken from different positions in relation to the object.

An optional feature of this invention is to move the enlarging lens at a speed faster while the projection light is off than when the exposure is being made. This reduces the time required to print photographs.

A printer that has the capability of continuously scanning the lenticules of the lenticular print material can be used to practice the method of this invention. It is only necessary to add means to such printer to intermittently turn on and turn off the light source. This can be done manually or preferably can be done automatically with a microprocessor or other control device. The apparatus needs to be controlled so that the images are laid down in a side-by-side relationship and with minimal overlapping and without a void between them. It is necessary to have the apparatus controlled in such a way so that the light source is on no longer than the time required for the lens to move a distance equal to one-tenth of its aperture and preferably as short as possible to produce high quality images. Preferably, only very short periods of exposure are used to print the images.

An additional feature of the printer of this invention is that it can be constructed so that the movement when the light source is off is faster than while the light source is on. This can be accomplished by utilizing a variable speed motor and a device to control the speed, such as a microprocessor. This variable speed results in faster printing than otherwise would occur.

The continuous scanning technique with the high-intensity exposures of short duration results in 3-D pictures of superior quality. The pictures are of superior quality because the images are not overlapping to a significant degree as is the case in the conventional scanning technique nor are there unexposed spaces between the images as in the case of the conventional intermittent projection technique.

Controlling the Intensity of the Image Band of a 3-D Picture

The ideal objective in printing a 3-D picture is for the image bands across the field of the lenticule to be of identical density so that from any viewing angle the eyes will see a stereo pair of image bands of identical density similar to the situation when viewing a real object. However, the vignetting effect of the lenticule results in the printing of a 3-D picture with the light reaching image bands near the edge of the lenticule being of lower intensity than the light reaching the image bands near the center. Consequently, image bands near the edge are of lower density than bands near the center. When the image bands near the center of the lenticule are brighter than the image bands near the edge of the lenticule, a person viewing a 3-D picture from an angle will see stereo pairs formed by two image bands of different density. The image band near the center of the lenticule is brighter than the image bands near the edge of the lenticule. This unmatched density of stereo pairs requires extra effort of the eyes to adjust resulting in eyestrain.

The inventor has developed a method of printing the image bands across the field of the lenticule so that they are of equal density. This method basically involves varying the intensity of exposure during the printing of the 3-D picture. The intensity of exposure of image bands is increased near the edge of the lenticule to compensate for the lower amount of light due to the vignetting curve of the lenticule. The vignetting effect is due in part to the fact that the length of travel of the light from the curvature of the lenticule to the printing surface is greater in respect to the image bands near the edges than in the center.

There are several methods of varying the intensity of exposure of the image bands in order to obtain identical density of the image bands across the field of the lenticule without affecting color temperature. In one of these methods, the intensity of exposure can be raised by varying the duration of exposure of the image bands between the center and the edge of the lenticule. This method can be utilized with an intermittent method of printing. It is not satisfactory with the continuous scanning technique because of the complexity of changing duration of exposure while scanning.

A second method is to use a neutral density filter in exposing the bands near the center of the lenticule and either using no filter in exposing the bands near the edge or using a filter that transmits a greater amount of light than the filter used in exposing the center bands. This method is best adapted to the intermittent technique of printing.

A third method is to use a neutral density filter iris which can be opened and closed to vary the intensity of the light as desired. This method can be used with both the intermittent and continuous scanning techniques.

A fourth method is to use a metallic iris with a multiple number of small apertures which can be opened and closed to vary the intensity of light as desired.

A fifth method is to use a multiple lamp housing in the printer and vary the intensity by turning on and off lamps during the exposure of the image bands. This method is well adapted for use with both the continuous and intermittent scanning techniques.

By using a greater intensity of light on the lenticular screen in exposing the image bands 71 and 74 in FIG. 3 than the image bands 75, 76, it is possible to obtain image bands across the lenticule of identical density. Preferably, the intensity of exposure is gradually raised across the field of the lenticule to obtain images of equal density. In viewing the pictures printed in this manner, a person will see stereo pairs of identical density which results in less eyestrain and pictures of higher quality.

The continuous scanning method with short bursts of light can be combined with the method of varying the intensity of exposure to produce pictures of higher quality than was possible before. In combining these methods a neutral density filter iris or a metallic iris with a multiple number of adjustable apertures or controlling the light in the multiple lamp housing can be used with the continuous scanning method with short bursts of light. The intensity of exposures will be varied so that the image bands near the edges of the lenticule are of the same density as the image bands in the center of the lenticule.

Figure 7:
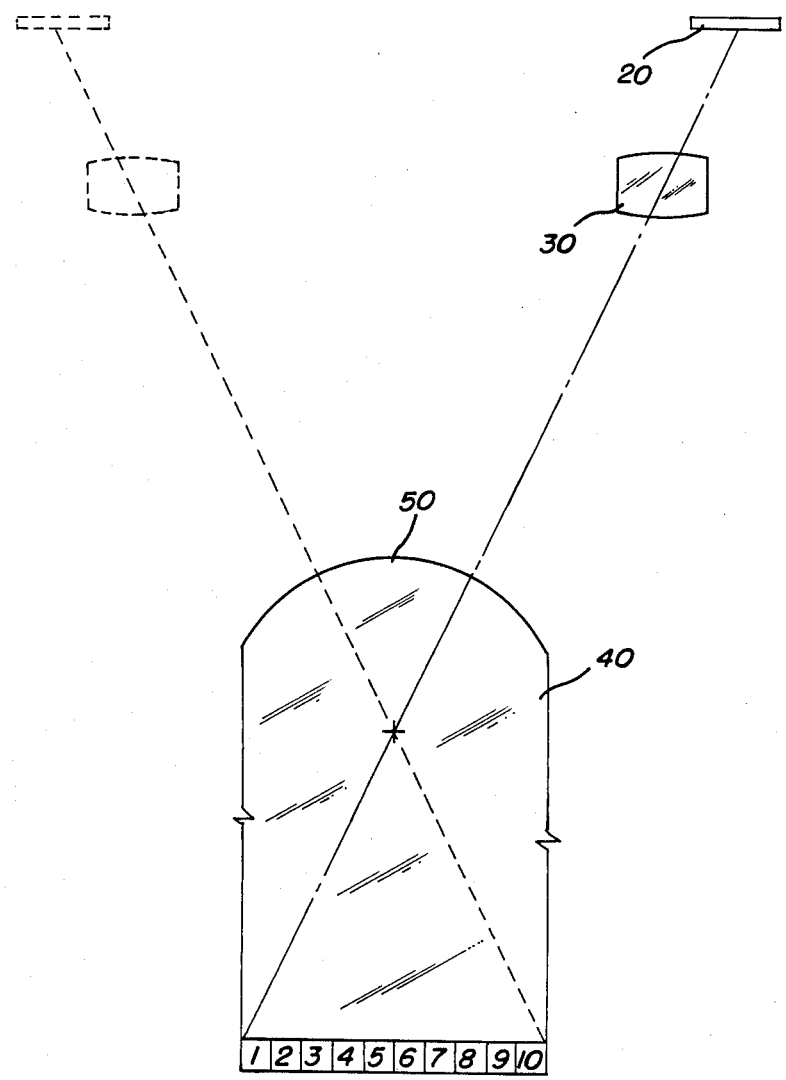
FIG. 7 is a diagrammatic view showing ten image bands across the field of a lenticule.

FIG. 7 illustrates the exposure of image bands across the field of the lenticule through the lenticule. The lens 30 and negative 20 start the exposure process in a position to the right of the lenticule and move to the left until all of the image bands are exposed. Image bands 4-7 will have a greater density than image bands 1-3 and 8-10 with image bands 1 and 10 being of the lowest density when exposed by the conventional printing technique.

Figure 8:
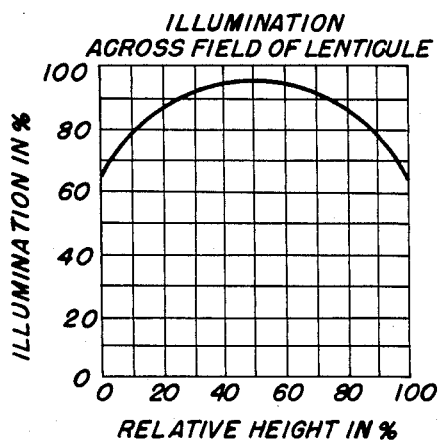
FIG. 8 is a graph showing the vignetting curve of illumination of the image bands in the lenticule.

FIG. 8 illustrates the illumination of the image bands across the field of the lenticule when the illumination of the light source is constant. One can see that the falloff in the illumination is from approximately 95 to 65% across the field of the lenticule.

Figure 9:
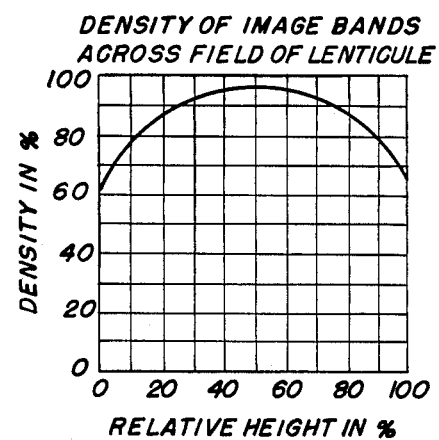
FIG. 9 is a curve showing the density of image bands in a lenticule when exposed by a scanning method.

FIG. 9 illustrates the density of the image bands across the field of the lenticule when exposed by the scanning method. One can see that the density falloff is identical in proportion to the illumination falloff.

Figure 10:
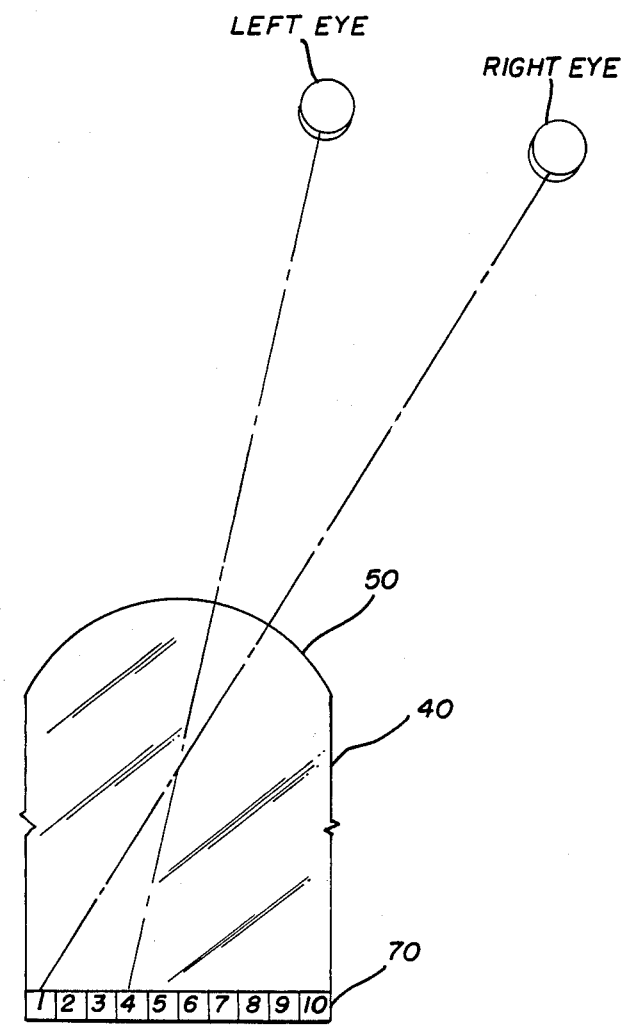
FIG. 10 is a diagrammatic view showing the eys seeing stereo pairs in the lenticule.

FIG. 10 illustrates a person viewing two image pairs 2 and 5 in the image bands 70. If this lenticule is printed in accordance with the teachings of the prior art (i.e., the light source remains constant), there will be a significant falloff in density between image band 5 and 2. Image band 2 will be darker than image band 5. The right eye will see image band 2, and the left eye will see image band 5 at the position of the lenticule 40 in relation to the person's eyes. As image band 2 is darker than image band 5, a person's eyes will become fatigued due to the unmatched density of the stereo pair.

Figure 11:
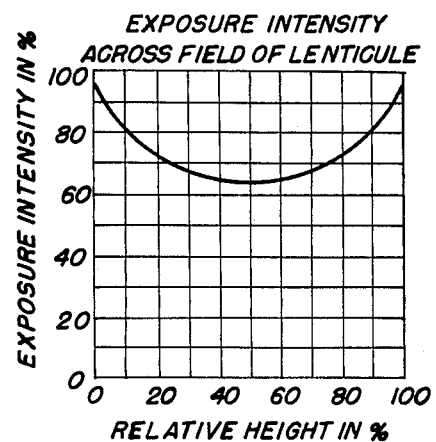
FIG. 11 is a graph showing the exposure curve required to compensate for the vignetting effect of the lenticule.

FIG. 11 illustrates the illumination of the lenticule in accordance with the teachings of this invention. The illumination of the lenticule is such that the illumination is less at the center of the lenticule than at the edges. This curve is the reverse of the illumination curve in accordance with the teachings of the prior art (FIG. 8).

Figure 12:
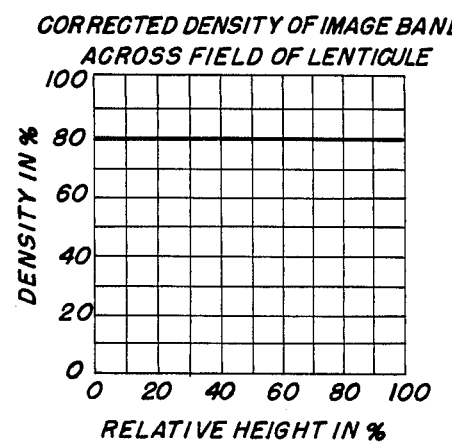
FIG. 12 is a graph showing the density of the image bands across the field of the lenticule exposed in accordance with the exposure curve of FIG. 12.

FIG. 12 illustrates the density curve of the image bands across the field of the lenticule when the lenticular screen is exposed to illumination in accordance with the exposure curve of FIG. 11. Equal density of image bands is obtained across the field of the lenticule due to the vignetting effect of the lenticule.

I claim:

1. An improved method of printing a three-dimensional image on a lenticular print material using a printer wherein;

said printer is comprised of means for holding a negative, an enlarging means, light projecting means, and means for changing the angle at which light is projected from the printer;

said lenticular print material is comprised of a lenticular screen having a plurality of lenticules;

said negative having a plurality of two-dimensional views of an object;

said printing being accomplished by projecting light through said projecting means and through said negative to expose said lenticular print material in such a way that a plurality of image bands are formed across the width of each lenticule;

the improvement in said method is accomplished by utilizing a greater intensity of light on the lenticular screen when exposing the image bands near the edges of the lenticule than those near the center of the lenticule in order to obtain image bands of substantially equal density across the width of the lenticule.

2. The method of claim 1 in which the printing is accomplished by continuously changing the angle of projection of the projected light passing through the enlarging lens in relation to the lenticular print material and the negative while gradually changing the intensity of the light projected on the lenticular screen so that there is greater intensity of light on the lenticular screen when exposing the image bands near the edges of the lenticule than those near the center of the lenticule.

3. The method of claim 1 in which the image bands are printed in a side-by-side relationship by continuously changing the angle of projection of the projected light passing through the enlarging lens in relation to the lenticular print material and the negative with the images on the negative being periodically projected through the lenticules of the lenticular print material, with exposure of each image to light from the light projecting means being of a duration no greater than the time required for the line of projection to move a distance no greater than that equivalent to one-tenth of the aperture of the enlarging lens.

4. The method of claim 3 in which the relative movement between the enlarging lens, lenticular print material and the negative is faster between exposures than during the exposure of the negative.

5. An improved method of printing a three-dimensional image on a lenticular print material using a printer wherein;

said printer is comprised of means for holding a negative, an enlarging means, light projecting means, and means for changing the angle at which light is projected from the printer;

said lenticular print material is comprised of a lenticular screen having a plurality of lenticules;

said negative having a plurality of two-dimensional views of an object;

said printing being accomplished by projecting light through said projecting means and through said negative to expose said lenticular print material in such a way that a plurality of image bands are formed across the width of each lenticule;

the improvement in said method is accomplished by continuously changing the angle of projection of the projected light passing through the enlarging lens in relation to the lenticular print material and the negative in order to print a plurality of discrete condensed images in a side-by-side relationship with exposure of each image to light being of a duration no greater than the time required for the line of projection to move a distance no greater than that equivalent to one-tenth of the aperture of the enlarging lens.

6. The method of claim 5 in which the relative movement between the enlarging lens, the lenticular print material and the negative is faster between exposures than during the exposure of the negative.

* * * * *